(12) United States Patent
Jansen et al.

(10) Patent No.: US 6,836,187 B2
(45) Date of Patent: Dec. 28, 2004

(54) RF PEAK-TO-PEAK DETECTOR WITH WIDE DYNAMIC RANGE

(75) Inventors: Bartholomeus Hendrik Jansen, Pacifica, CA (US); Ray Myron Parkhurst, Fremont, CA (US); Justin Walter Clark, Bristol (GB)

(73) Assignee: Agilent Technologies, Inc, Palo Alto, CA (US)

( * ) Notice: Subject to any disclaimer, the term of this patent is extended or adjusted under 35 U.S.C. 154(b) by 0 days.

(21) Appl. No.: 10/252,923

(22) Filed: Sep. 23, 2002

(65) Prior Publication Data

US 2004/0056720 A1 Mar. 25, 2004

(51) Int. Cl.[7] .............................................. H03G 3/30
(52) U.S. Cl. ...................... 330/279; 330/127; 330/129
(58) Field of Search .......................... 330/85, 127, 129, 330/279, 297

(56) References Cited

U.S. PATENT DOCUMENTS

| | | | | |
|---|---|---|---|---|
| 4,736,391 A | * | 4/1988 | Siegel | 375/317 |
| 5,208,550 A | * | 5/1993 | Iwane | 330/279 |
| 5,214,393 A | * | 5/1993 | Aihara | 330/279 |
| 5,724,003 A | | 3/1998 | Jensen et al. | |
| 5,841,319 A | * | 11/1998 | Sato | 330/129 |
| 6,204,727 B1 | | 3/2001 | Wey et al. | |
| 6,233,440 B1 | | 5/2001 | Taylor | |
| 6,297,709 B1 | | 10/2001 | Wey et al. | |
| 6,304,145 B1 | | 10/2001 | Laureanti et al. | |
| 6,370,358 B2 | | 4/2002 | Liimatainen | |
| 6,370,364 B1 | | 4/2002 | Liimatainen | |
| 6,417,729 B1 | | 7/2002 | Lemay et al. | |
| 2001/0036816 A1 | | 11/2001 | Wieck | |

FOREIGN PATENT DOCUMENTS

FR  2532802 A  9/1982

OTHER PUBLICATIONS

Data Sheet, "Agilent ATF–551M4 LowNoise Enhancement Mode Pseudomorphic HEMT in a Miniature Leadless Package," dated Nov. 8, 2001, by Agilent Technologies, 24 pages.
Data Sheet, "CGY2015 GSM/DCS/PCS power amplifier," dated Mar. 12, 2002, by Philips Semiconductors, 24 pages.
"GaAs MMIC power amplifier targets GPRS handsets," webpage describing CGY2015 product of Philips Semiconductors, printed on Jul. 28, 2002 from website: www.semiconductors.philips.com/news/publications/content/file_726.html, 1 page.

* cited by examiner

*Primary Examiner*—Khanh Van Nguyen

(57) ABSTRACT

A temperature and process compensated voltage controlled amplifier circuit achieves a prescribed power level over a wide dynamic range. The amplifier circuit has a power amplifier and a peak-to-peak detector that are integrated parts of an integrated circuit. The power amplifier outputs an amplified RF signal having an amplified peak-to-peak voltage amplitude. The peak-to-peak detector receives the amplified RF signal and generates a detector output signal having a direct current voltage component that is substantially proportional to the amplified peak-to-peak voltage amplitude. The power amplifier receives the detector output signal and uses it to achieve an amplified peak-to-peak voltage amplitude corresponding to a prescribed power level. The peak-to-peak detector includes transistors with identical threshold voltages. Despite temperature and process variations, the direct current voltage component of the detector output signal does not vary with temperature and process variations with respect to the ground voltage of a battery.

18 Claims, 5 Drawing Sheets

RF PEAK-TO-PEAK DETECTOR WITH WIDE DYNAMIC RANGE

BACKGROUND

The present invention is directed towards the technology of signal transmission, and, specifically towards electronic circuits for power amplification.

Mobile communication devices, for example cellular telephones, need to transmit radio frequency (RF) signals at prescribed power levels. The prescribed power levels are dictated by the radio protocol standard under which the mobile device is operating. For example, in a GSM (Global System for Mobile communication) network, a mobile device transmits RF signals to base stations over a wide dynamic range, for example, up to 35 dBm, depending on the strength of the transmitted signal that the base station is receiving.

When transmission is initiated, the mobile device needs to reach the prescribed power level quickly, typically within about 30 microseconds. Further, the power level of the RF output signal must be maintained at the prescribed constant level.

To achieve the transmission power level, mobile devices include power amplifiers to amplify internally generated RF signals (RF input signal, or RF_IN) to RF transmission signals (RF output signal, or RF_OUT) having the prescribed power level. To maintain the power level of the RF output signal constant, a feedback control loop circuit is often used.

FIG. 1 (prior art) illustrates a simplified diagram of an RF amplifier circuit 20 having a known design. Here, a power amplifier 22 amplifies the RF input signal 21 and generates the RF output signal 23. To hold the power of the RF output signal 23 constant, a feedback control loop 25 is used. In feedback control loop 25, a resistor 24 connected to the power amplifier 22 is used to sample the current drawn by the power amplifier 22 by detecting the voltage drop across the resistor 24. The voltage drop is amplified and the amplified voltage is compared with a reference voltage, $V_{REF}$. The reference voltage can be at the prescribed power level. The difference between the amplified voltage and the $V_{REF}$ is an automatic power control input voltage $V_{APC}$. The $V_{APC}$ is then applied to the power amplifier 22. This negative feedback loop 25 causes the power amplifier 22 to draw a supply current that is proportional to the $V_{REF}$. The power of the output signal 23 of the power amplifier 22 is proportional to the supply current. The supply current is drawn from a battery illustrated as the battery voltage $V_{BAT}$ in FIG. 1.

In this design, the amplifier circuit 20 has the disadvantage that the voltage drop across the resistor 24 reduces the voltage available to the power amplifier 22, thus lowering the power added efficiency of the amplifier circuit 20. In addition, the resistor 24 is a small low-tolerance resistor that can handle a high current. Such resistors tend to be expensive.

FIG. 2 (prior art) illustrates a simplified diagram of an RF amplifier circuit 30 again having a known design. Here, a power amplifier 32 amplifies the RF input signal 21 and generates an output signal 31 that is operated on by a feedback control circuit 35 before being directed to RF output node 33. In the feedback control circuit 35, a directional coupler 34 directs most of the output signal 31 to the RF output node 33, but a portion ("coupled signal") of the output signal 31 is directed to a detector 36. The detector 36 detects the peak voltage amplitude of the coupled signal and sends the detected voltage to an error amplifier 38. The detector 36 generally contains a detector diode and a reference diode. The error amplifier 38 compares the detected voltage, $V_{DETECTED}$, to the $V_{REF}$ and generates an amplified automatic power control signal, $V_{APC}$, having a voltage proportional to the difference between $V_{DETECTED}$ and $V_{REF}$. The output of the error amplifier 38 is applied to the power amplifier 32.

In this design, the amplifier circuit 30 has the disadvantage that the coupler 34 reduces the "through output" power of the amplified output RF signal 31. The "coupled output" power is also reduced. Depending on the implementation, the reduction in through output power by the coupler 34 can be significant, thus decreasing the power added efficiency of the amplifier circuit 30. Further, the amplifier circuit 30 can be sensitive to temperature in its ability to operate properly. The correlation between the power of the output signal 31 and the $V_{DETECTED}$ can change with temperature variations. This is because, in a typical layout, the components of the amplifier circuit 30 are discrete components and that the components are not sufficiently proximal to each other within the amplifier circuit 20. In fact, components such as the coupler 34 are surface mount (SMT) components that take a relatively large area. Finally, the dynamic range of amplifier circuit 30 is limited. This is because the coupled signal is 10 to 13 dB lower than the output signal 31. As the power of the output signal 31 decreases, the voltage of the coupled signal can become insufficient to turn on the detector 36.

Accordingly, there remains a need for an improved power amplifier circuit.

SUMMARY

These needs are met by the present invention. According to one aspect of the present invention, an amplifier circuit includes an amplifier amplifying an input voltage signal to generate an amplified voltage signal and a peak-to-peak detector connected to the amplifier detecting peak-to-peak voltage of the amplified signal to generate a detected signal. A comparator, connected to the amplifier and the peak-to-peak detector, compares the detected signal to a reference voltage signal, generating an automatic power control signal for controlling the amplifier.

According to another aspect of the present invention, an integrated circuit includes a negative peak detector receiving an input voltage signal and generating a first intermediate signal and a positive peak detector. The positive peak detector receives the first intermediate signal and generates a detected signal, the detected signal having value of peak-to-peak voltage of the input signal. The detected signal is substantially a direct current (DC) voltage.

According to yet another aspect of the present invention, a method of amplifying a signal is disclosed. First, an input RF signal is amplified, using an amplifier, to generate an amplified signal. Next, the peak-to-peak voltage of the amplified signal is detected using a peak-to-peak detector. The detected voltage is compared with a reference voltage to produce an automatic power control input signal. Finally, the automatic power control input signal is applied to the amplifier to control the degree of amplification.

Other embodiments and advantages of the present invention will become apparent from the following detailed description, taken in combination with the accompanying drawings, illustrating by way of example the principles of the invention.

DETAILED DESCRIPTION

The present invention, in one embodiment, is an amplifier circuit that includes an amplifier for amplifying an input signal to generate an amplified signal. A peak-to-peak detector detects the peak-to-peak voltage of the amplified signal to generate a detected signal. A comparator compares the detected signal to a reference signal to generate an automatic power control signal for controlling said amplifier.

The amplifier circuit achieves and maintains a prescribed power level over a wide range of power, fabrication processes and temperature. The peak-to-peak detector is integrated into the amplifier circuit and includes transistors whose threshold voltages change in unison with varying temperatures and fabrication processes. An added benefit of integrating the peak-to-peak detector into the amplifier circuit is the reduced power consumption and size of the amplification circuit.

Figure 3:
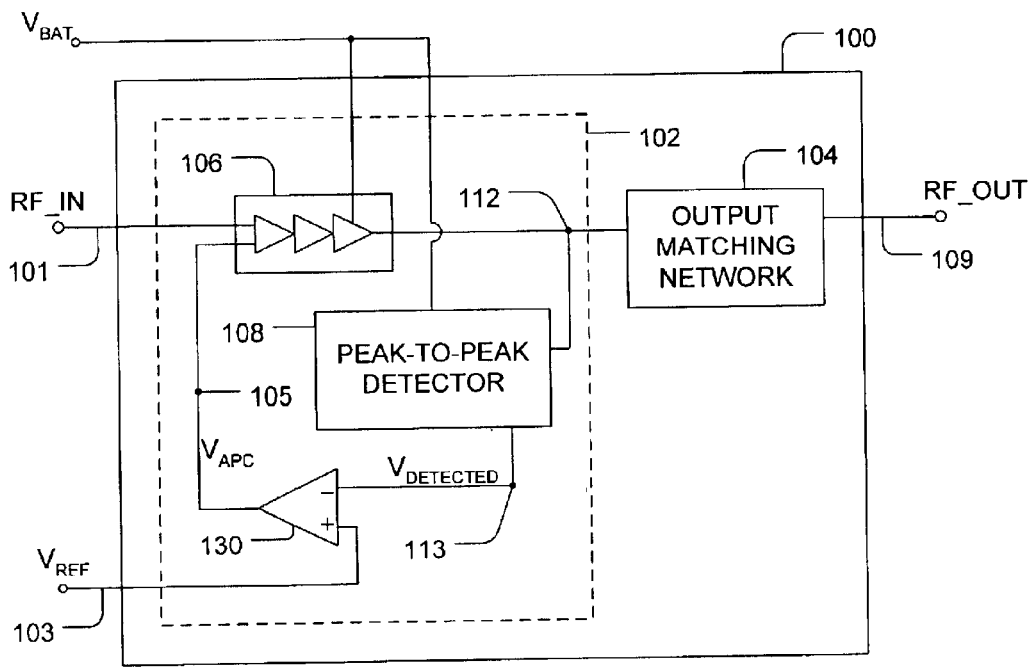
FIG. 3 illustrates a simplified block diagram of an amplifier circuit according to one embodiment of the present invention.

FIG. 3 is a simplified block diagram of a power amplifier circuit 100 (also referred to as the "circuit 100") according to one embodiment of the present invention. The amplifier circuit 100 can be a part of a mobile handset. The amplifier circuit 100 includes a power amplifier 106 to amplify an RF input signal 101, RF_IN, to produce an amplified signal at node 112. In one embodiment, the RF input signal 101 and the amplified signal 112 both have frequencies above 400 MHz.

Various nodes of the circuit 100 are designated using reference numbers in FIG. 3 and in subsequent Figures. For convenience, the same reference number is used to designate a node as well as the signal present at the node. An output matching network 104 is used to step-up the voltage of the amplified signal 112 and is further discussed below in reference to FIG. 6.

A peak-to-peak detector 108 (also referred to as the "detector 108") and a comparator 130 combine to operate as a power control loop to maintain a desired level of power in the RF output signal 109.

In the illustrated embodiment, the peak-to-peak detector 108 is connected to the amplifier 106 via the node 112. The detector 108 detects a peak-to-peak voltage level of the amplified signal 112 and generates a detected signal voltage, $V_{DETECTED}$, present at node 113. The $V_{DETECTED}$ 113 is sent to the comparator 130. The comparator 130 compares the $V_{DETECTED}$ 113 to a reference voltage 103, $V_{REF}$, to generate an automatic power control input signal 105, $V_{APC}$. The $V_{APC}$ is a voltage signal proportional to the difference between the $V_{DETECTED}$ 113 and the $V_{REF}$ 103. The $V_{APC}$ 105 is applied to the power amplifier 106 to control the degree of amplification of the input RF signal 101 to maintain a desired level of power in the amplified signal 112, thus maintaining a prescribed level of power in the RF output signal 109.

In the power control loop (including the detector 106 and the comparator 108), the reference voltage ($V_{REF}$) 103 can be calibrated such that the circuit 100 generates the RF output signal 109 having power levels prescribed by the mobile device manufacturer. The $V_{REF}$ 103 can be set to correspond to a wide range of power levels, for example, from zero power to 35 dBm. During GSM signal transmission for example, which uses a time division multiple access (TDMA) protocol, the power amplifier circuit 100 is operated through its entire range of power at every time slot. A time slot for GSM occurs every 577 microseconds, and the signal power is ramped up during the first 30 microseconds of the time slot. By accurately ramping up to the desired power level within a maximum and minimum ramp-up speed, spectral spreading from transmitting information above the data rate can be reduced. The power amplifier 106 is then turned off after each time slot.

Continuing to refer to FIG. 3, a single integrated circuit chip 102 can include the power amplifier 106, the detector 108, and even the comparator 103. The integrated circuit 102 can be a monolithic microwave integrated circuit (MMIC). In the illustrated embodiment, the power amplifier 106 includes a series of three cascaded amplifiers. In other embodiments, however, the power amplifier can include one or a plurality of amplifiers. Further, in an alternative embodiment, the comparator 130 is integrated into the detector 108. Here, for simplicity, the detector 108 and the comparator 130 are treated as separate portions of the integrated circuit 102.

Figure 1:
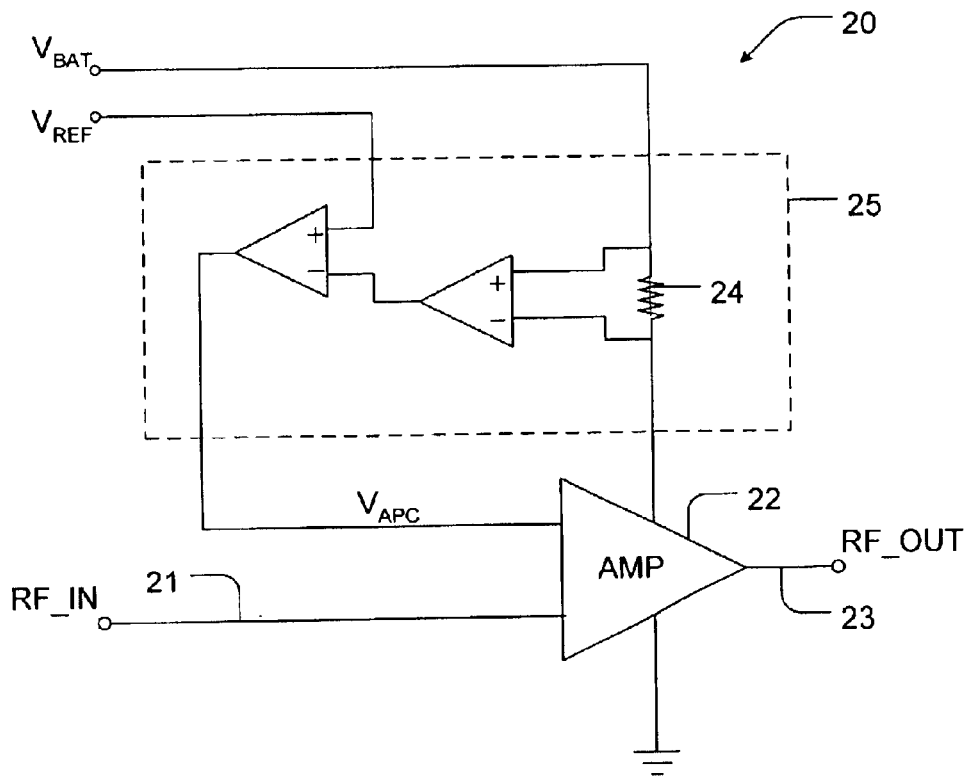
FIG. 1 (prior art) illustrates a simplified block diagram of a known RF amplifier circuit.
Figure 2:
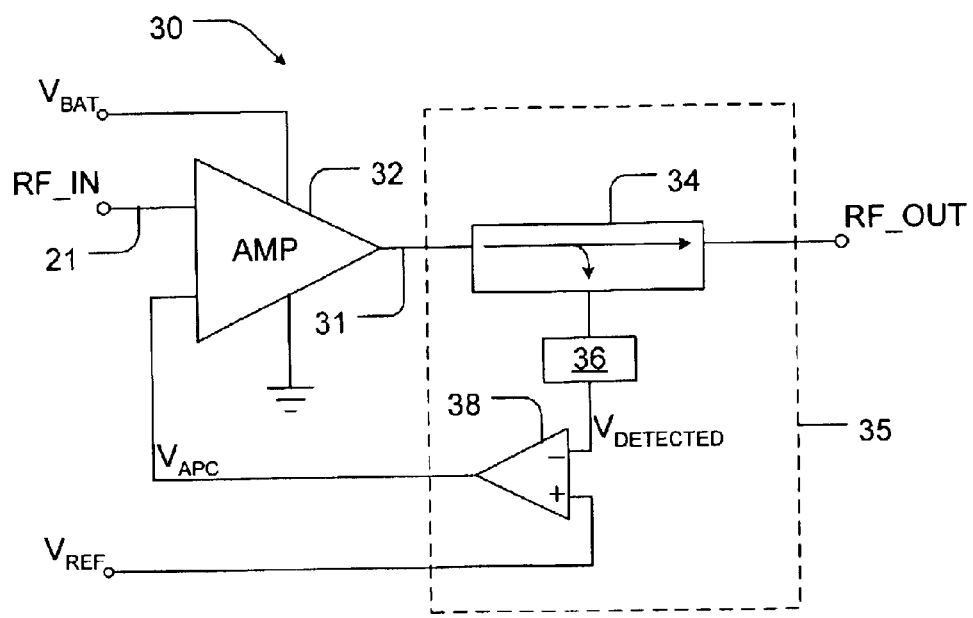
FIG. 2 (prior art) illustrates a simplified block diagram of another known RF amplifier circuit.

In the power amplifier circuit 100, the power control loop is formed without a coupler as illustrated in FIG. 2. The design of the power amplifier circuit 100 reduces the number of components compared to that of the amplifier circuit 30 of FIG. 2 and thereby reduces the relative cost and size of the circuit 100. At today's prices, each coupler can cost about 30 cents. Further, an SMT (surface mount technology) directional coupler alone can be 0.5 square millimeters large whereas an entire amplifier circuit 100 on a chip can have an area of about only twice that size. Thus, eliminating the coupler, as well as the associated detector and bias circuitry, can reduce the size of the amplifier circuit several times. Moreover, the amplified RF signal 112 in power amplifier circuit 100 does not lose power by traveling through a coupler on its way from the power amplifier 106 to peak-to-peak detector 108. This design saves battery power and prolongs battery life. In addition, because no power is lost on the coupled output, the peak-to-peak voltage amplitude of signals having less power at specified impedance can be detected.

Figure 4:
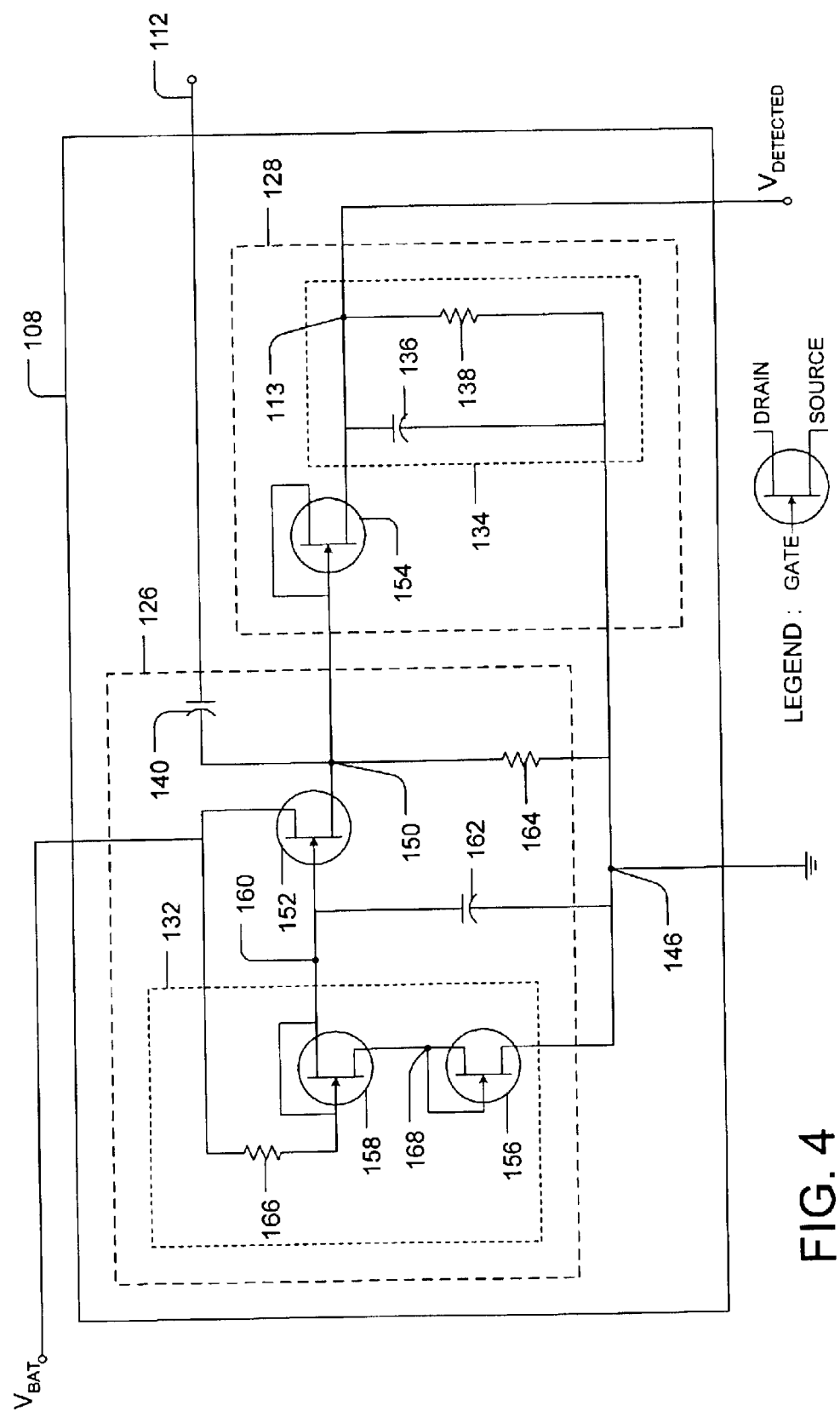
FIG. 4 illustrates a detailed view of the peak-to-peak detector of the amplifier circuit in FIG. 3.

FIG. 4 illustrates one embodiment of the peak-to-peak detector 108 of FIG. 3 in a greater detail. Again, various nodes of the circuit 100 are designated using reference numbers. For convenience, the same reference number is used to designate a node as well as the signal present at the node.

The detector 108 includes a negative peak detector 126 and a positive peak detector 128. The negative peak detector 126 receives the amplified voltage signal 112 and generates a first intermediate voltage signal, present at node 150. The positive peak detector operates on the first intermediate signal 150 and generates a second intermediate signal at node 113. The second intermediate signal 113 is also referred to as the detected signal voltage, $V_{DETECTED}$ 113.

The peak-to-peak detector 108 converts the peak-to-peak voltage amplitude of the amplified RF signal 112 present on node 112 to a second intermediate signal 113 having a second direct current voltage component that is proportional to the peak-to-peak voltage amplitude of the amplified RF signal 112.

Electrical values of the various components of the circuit 100 can vary widely depending on the implementation, RF frequency, and process technology used. The values discussed in this document only suggest the values of a sample embodiment and does not limit the scope of the present invention.

Negative Peak Detector

Referring to FIG. 4, the negative peak detector 126 includes a blocking capacitor 140, a first FET (field effect transistor) 152, a stabilizing capacitor 162, a first resistor 164, and a temperature and process compensating reference voltage generator 132. The temperature and process compensating reference voltage generator 132, in turn, includes a second FET 156 and a third FET 158 along with a second resistor 166.

In one embodiment, the blocking capacitor 140 and the stabilizing capacitor 162 have capacitance in the order of pico-farads and can be, for example, ten pico-farad each. The first resistor 164 has resistance in the order of hundreds of ohms and can be, for example, 500 ohms. The second resistor 166 has resistance in the order of thousands of ohms and can be, for example, 2,000 ohms.

Positive Peak Detector

The positive peak detector 128 includes a fourth FET 154 and a ripple filter 134. The ripple filter has a third capacitor 136 and a third resistor 138 connected to the third capacitor 136. Each of the transistors illustrated in FIG. 4 has a source, a drain, and a gate portion as illustrated in the Legend of FIG. 4.

In one embodiment, the third capacitor 136 has capacitance in the order of hundreds of pico-farads and can be, for example, 500 pico-farad. The third resistor 138 has resistance in the order of thousands of ohms and can be, for example, 2,000 ohms.

Representative Waveforms

Figure 5:
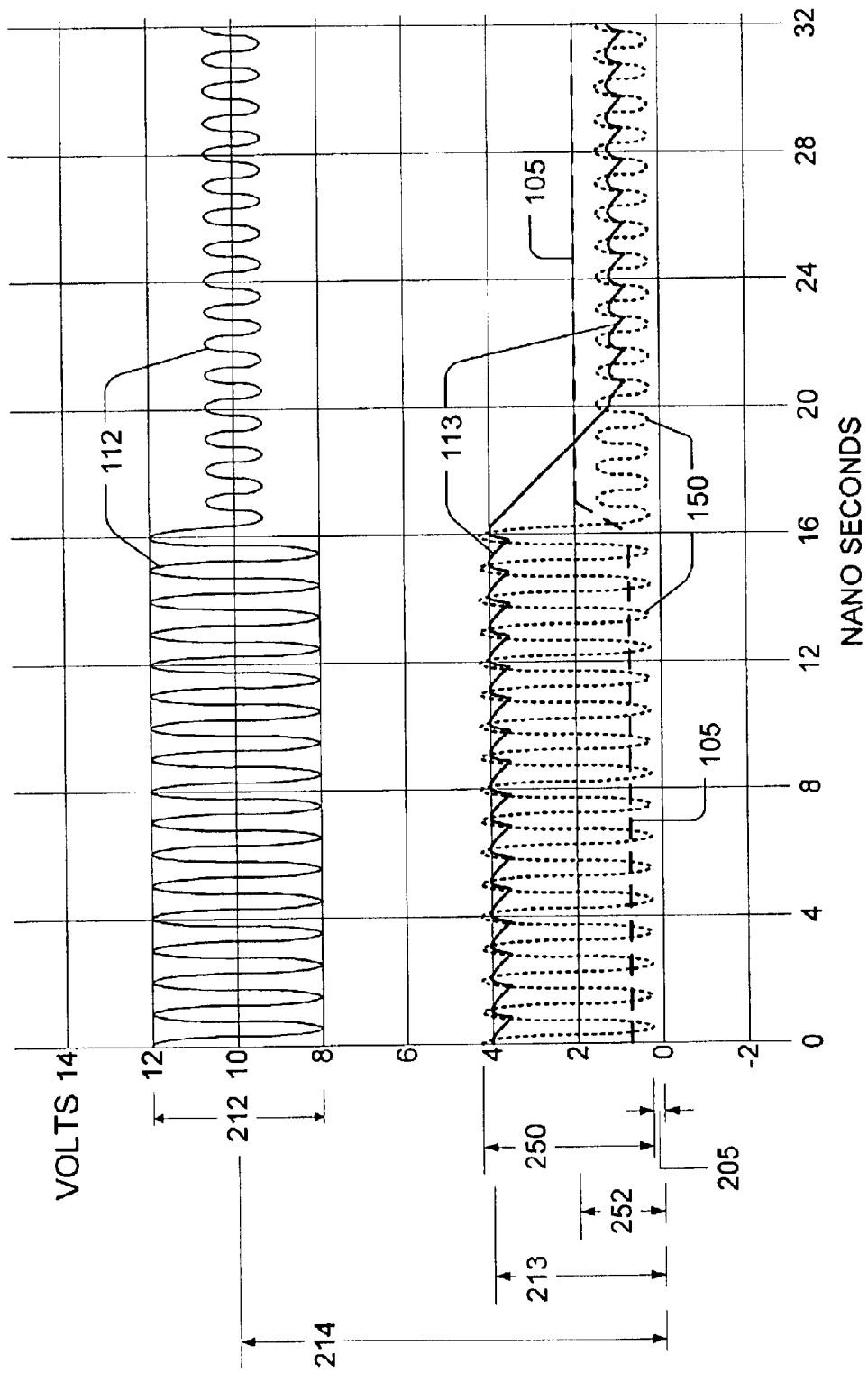
FIG. 5 illustrates graphs showing waveforms at various nodes of the amplifier circuit of FIGS. 3 and 4.

FIG. 5 is a graph illustrating ideal representative waveforms at various nodes of the amplifier circuit 100 of FIGS. 3 and 4. FIG. 5 illustrates these waveforms at two different power levels (or voltage amplitudes)—the first power level between zero and 16 nanoseconds, and a second power level at between 16 to 32 nanoseconds.

Shown are the amplified signal 112, first intermediate signal 150, and second intermediate signal 113 which is also referred to as the detected signal voltage 113. Also illustrated are the following: a peak-to-peak voltage amplitude 212 and a direct current voltage component 214 of the amplified RF signal 112; a peak-to-peak voltage amplitude 250 and a first direct current voltage component 252 of the first intermediate signal 150; and a second direct current voltage component 213 of the second intermediate signal 113. For simplicity, these values are illustrated only for the portions of the signals 112, 150, and 113 within the first power level between zero to 16 nanoseconds. The peak-to-peak voltage amplitude of the second intermediate signal 113 is small and results from the voltage discharge produced by a ripple filter 134 as discussed below.

Operations of the Peak to Peak Detector

Operations of the detector 108 of FIG. 4 and its various components are discussed with references to the representative voltage signal waveforms illustrated by FIG. 5.

Referring to FIGS. 4 and 5, the amplified signal 112 from the power amplifier 106 of FIG. 3 enters the detector 108, and more specifically the negative peak detector 126, through a blocking capacitor 140. As the amplified RF signal 112 passes through the blocking capacitor 140, its direct current voltage component is removed. In another embodiment, excessive RF current is limited from reaching FET 152 and FET 154 by a series resistor (not shown in the Figures) in series with capacitor 140.

As the amplified signal 112 is received by the blocking capacitor 140, on a negative peak swing, the source of FET 152 provides the current that charges the blocking capacitor 140. A battery $V_{BAT}$ is coupled to the drain of FET 152 and is the ultimate current source. When the amplified RF signal 112 swings to a positive peak, the first FET 152 turns off, and the charge on the blocking capacitor 140 is dumped through a fourth FET 154 (of the positive peak detector 128) to the third capacitor 136 and is detected at node 113. Then the charge is dissipated by the third resistor 138 in relation to the time constant of the third capacitor 136 and the third resistor 138.

The negative peak detector 126 imparts a first direct current voltage component 252 to the first intermediate signal 150 after blocking capacitor 140 removes the direct current voltage component from the amplified RF signal 112. The negative peak detector 126 includes a temperature and process compensating reference voltage generator 132 that, together with the FETs 152 and 154, keeps the voltage at node 113 substantially at zero volts when the voltage of the amplified RF signal 112 is zero volts, regardless of temperature and process variations. This is because all of the FETs 152, 154, 156 and 158 are fabricated within the same integrated circuit 102 of FIG. 3, thus experience the same environmental conditions.

At node 150, the amplified RF signal 112 has been transformed into a first intermediate signal 150 having a first peak-to-peak voltage amplitude 250 proportional to the peak-to-peak voltage amplitude 212 of the amplified RF signal 112. Moreover, the first intermediate signal 150 has a first direct current voltage component 252 that, for a sinusoidal waveform, is substantially equal to one half of the first peak-to-peak voltage amplitude 250. For non-sinusoidal time domain waveforms of the first intermediate signal 150, the first direct current voltage component 252 is approximately equal to the integral of the time domain voltage signal waveform of the first intermediate signal 150 throughout a time period divided by that time period. The first intermediate signal 150 is present between the source of the first FET 152 and the gate of the fourth FET 154, which is a part of the positive peak detector discussed in more detail below. The FETs 154, 156, and 158 are diode-connected transistors, whereas the first FET 152 (also referred to as the "biased FET 152") is biased by a voltage applied to its gate that is present throughout node 160. Each of the FETs 152, 154, 156, and 158 has an identical threshold voltage ($V_{TH}$). The threshold voltage is illustrated as 205 in FIG. 5.

The voltage present at node 160 is stabilized by the stabilizing capacitor 162 as the sum of the threshold voltages of the second FET 156 and the third FET 158—these threshold voltages are referred to as $V_{TH}[156]$ and $V_{TH}[158]$, respectively. The second resistor 166 draws current from a voltage source, typically a battery and illustrated as $V_{BAT}$, and biases up the two diode-connected transistors FET 156 and FET 158, thereby establishing the $V_{TH}[156]$ and the $V_{TH}[158]$ as direct current voltages. The voltage present at the node 168 equals the $V_{TH}[156]$.

A small current is drawn by the first FET 152 through the first resistor 164, which biases the first FET 152 into a linear region of operation. As the first FET 152 draws current when the voltage present at node 160 exceeds the voltage present at node 150 by more than the threshold voltage of the first FET 152, $V_{TH}[152]$, the minimum voltage present at node 150 is maintained at a voltage equal to $V_{TH}[156]$ plus $V_{TH}[158]$ minus $V_{TH}[152]$.

These three threshold voltages—$V_{TH}[156]$, $V_{TH}[158]$, and $V_{TH}[152]$—are equal because the FETS 152, 154, 156, and 158 are the same type of transistor. Accordingly, the minimum voltage at node 150 is one threshold voltage 205. The blocking capacitor 140, in conjunction with the biased FET 152, the diode-connected FETs 156 and 158, and the stabilizing capacitor 162, operate to place the negative peaks of the first intermediate signal 150 at the minimum voltage at node 150, which equals one threshold voltage.

Accordingly, the first intermediate signal 150 present at node 150 has a first direct current voltage component 252 that is substantially equal to the integral of the time domain voltage signal waveform of the first intermediate signal 150 throughout a time period divided by that time period, plus the relatively small threshold voltage $V_{TH}[152]$. For sinusoidal waveforms of the first intermediate signal 150, the first direct current voltage component 252 is substantially equal to one half of the first peak-to-peak voltage amplitude 250 plus the threshold voltage $V_{TH}[152]$.

At the node 113, the first intermediate signal 150 has been transformed into a second intermediate signal 113 having a second direct current voltage 213 component with voltage proportional to the peak-to-peak voltage amplitude 250 of the first intermediate signal 150. The third capacitor 136 and the third resistor 138 form a ripple filter 134 that, together with the diode-connected fourth transistor 154, produce a waveform having a ripple at the positive peaks of the second intermediate signal 113. These components form the positive peak detector 128.

In the positive peak detector 128, the fourth FET 154 is biased with a small standing current through the third resistor 138. As the fourth FET 154 draws current when the voltage present at node 150 exceeds the voltage present at node 113 by more than the threshold voltage of FET 154, $V_{TH}[154]$, the minimum voltage present at node 113 is maintained at a voltage approximately equal to the ground voltage at node 146. The voltage present between the source of the fourth FET 154 and the node 113 is $V_{TH}[156]+V_{TH}[158]-V_{TH}[152]-V_{TH}[154]$ which is approximately zero, or the ground 146 potential. This is because, as already discussed, these transistors are the same type of transistor and have the same threshold values.

Despite temperature and process variations, the second direct current voltage 213 component present at node 113 remains at a voltage that is established in relation to the ground voltage 142.

If the amplified RF signal 112 were to have a zero value (not illustrated), the corresponding second direct current voltage component equals the ground voltage 142, which is typically zero. The ground voltage is defined as zero within the circuit 100. The second direct current voltage component 213 for a zero amplitude input signal (not illustrated) does not vary from the ground voltage even when the threshold voltage, $V_{TH}$, of the transistors changes with temperature and process variations because each $V_{TH}$ changes by the same amount. Two threshold voltages ($V_{TH}[156]+V_{TH}[158]$) minus two threshold voltages ($V_{TH}[152]+V_{TH}[154]$) continues to yield approximately zero volts. Therefore, the performance of peak-to-peak detector 108 is largely process and temperature independent.

The second direct current voltage 213 component of the second intermediate signal 113 is not only proportional to, but is also nearly equal to, the peak-to-peak voltage amplitude 250 of the first intermediate signal 150. A small remaining difference between the second direct current voltage 213 component and the peak-to-peak voltage amplitude 250 of the first intermediate signal 150 depends on the time constant of the ripple filter 134. The minimum voltage at node 113 has dropped by one threshold voltage in relation to the minimum voltage at node 150, thereby removing the threshold voltage $V_{TH}[152]$ from the first direct current voltage 252 component and placing the second direct current voltage 213 component near the peak voltage of each peak of the first intermediate signal 150. The second direct current voltage component 213 is the detected voltage ($V_{DETECTED}$) 113 and approximates the peak-to-peak voltage of the first intermediate signal 150, which in turn is proportional to the peak-to-peak voltage of the amplified RF signal 112. The $V_{DETECTED}$ is present at node 113.

As already described, the $V_{DETECTED}$ 113 is compared with the $V_{REF}$ 103 by the comparator 103 of FIG. 3. The comparator generates the automatic power control input signal 105, $V_{APC}$. The $V_{APC}$ for the illustrated waveform is illustrated as graph 105.

Implementations

As discussed, in an alternative embodiment of the present invention, the detector 108 can also include a comparator such as the comparator 130 of FIG. 3 as part of the detector 108.

In one embodiment, the detector 108 is implemented in an enhancement-mode pseudomorphic high-electron-mobility (ePHEMT) FET process. The ePHEMT FET process allows for a sensitivity sufficient to detect peak-to-peak voltage swings of amplified RF signals 112 whose voltages have not yet been augmented by the output matching network 104 of FIG. 3. Agilent Technology, Inc.'s ATF-551 Low Noise Enhancement Mode Pseudomorphic HEMT can be used in the detector 108.

Other embodiments of a peak-to-peak detector can be implemented with other types of transistors, such as MOSFETs (Metal Oxide Semiconductor Field Effect Transistor), CMOS FETs, Silicon Bipolar Transistors, and HBTs (Heterojunction Bipolar Transistors).

Alternative implementations of the detector 108 remain temperature and process compensated so long as the transistors at the locations 152, 154, 156 and 158 are replaced by other transistors all of the same type. A peak-to-peak detector can also be implemented using diodes, such as Schottky diodes, in place of the transistors 154, 156, and 158. The transistor 152 needs to remain a component that can be biased, such as some type of transistor. A peak-to-peak detector implemented using diodes in place of the ePHEMT FETs would be partially temperature and process compensated.

Output Matching Network

Figure 6:
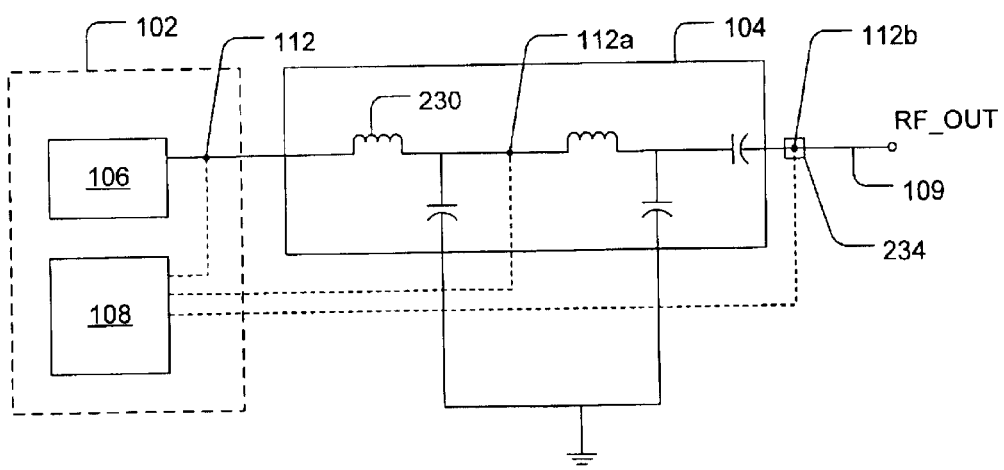
FIG. 6 illustrates a more detailed view of another portion of the amplifier circuit of FIG. 3.

FIG. 6 illustrates one embodiment of the output matching network 104 of FIG. 3 in more detail and portions of the power amplification circuit 100 of FIG. 3. The output matching network 104 is an impedance transformer that uses LC circuits including bias inductor 230 to transform high current low voltage signals to lower current and higher voltage signals to step up the voltage. In FIGS. 3 and 4, the detector 108 is illustrated as connecting to the node 112 for accessing the amplified signal at 112 from the power amplifier 106 at node 112. In FIG. 6, nodes 112a and 112b are illustrated as alternative connection points for the detector 108 to access a partially stepped-up amplified signal at 112a or a fully stepped-up amplified signal at 112b. Present at the node at 112b is the same signal as the RF output signal 109. A bond pad 234 can be used to make the connection to the node 112b. The alternative connections from the nodes 112a and 112b to the detector 108 as well as the connection from the node 112 to the detector are illustrated using dashed lines.

If the detector 108 is connected to the node 112, the connection lies entirely within the integrated circuit chip 102. With the connection to the node 112, the detector 108 can generate as output a second intermediate signal whose second direct current voltage component is proportional to a peak-to-peak voltage amplitude of an amplified RF signal of only about 0.355 V. For a load impedance of 50 Ohms, an RF signal with a 0.355 V peak-to-peak voltage amplitude has a power of about −5 dBm. Detecting the voltage of a coupled signal in the prior art that has lost between 10 and 13 dB in its coupled output power from the −5 dBm amplified RF signal would yield less accurate results because the peak-to-peak voltage available for detection would be only about 0.112 V, assuming the same load impedance of 50 Ohms.

Alternatively, the sensitivity of the detector 108 is increased if the detector 108 is connected to one of the alternative connections at nodes 112a or 112b. This can be useful when the desired output power of the RF output signal 109 is relatively low. The partially stepped-up amplified signal at the node 112a has a higher voltage than the amplified signal at the node 112 but lower current. The fully stepped-up amplified signal at the node 112b has even a higher voltage than the amplified signal at the node 112 but even less current.

Sample GSM Waveforms

Figure 7:
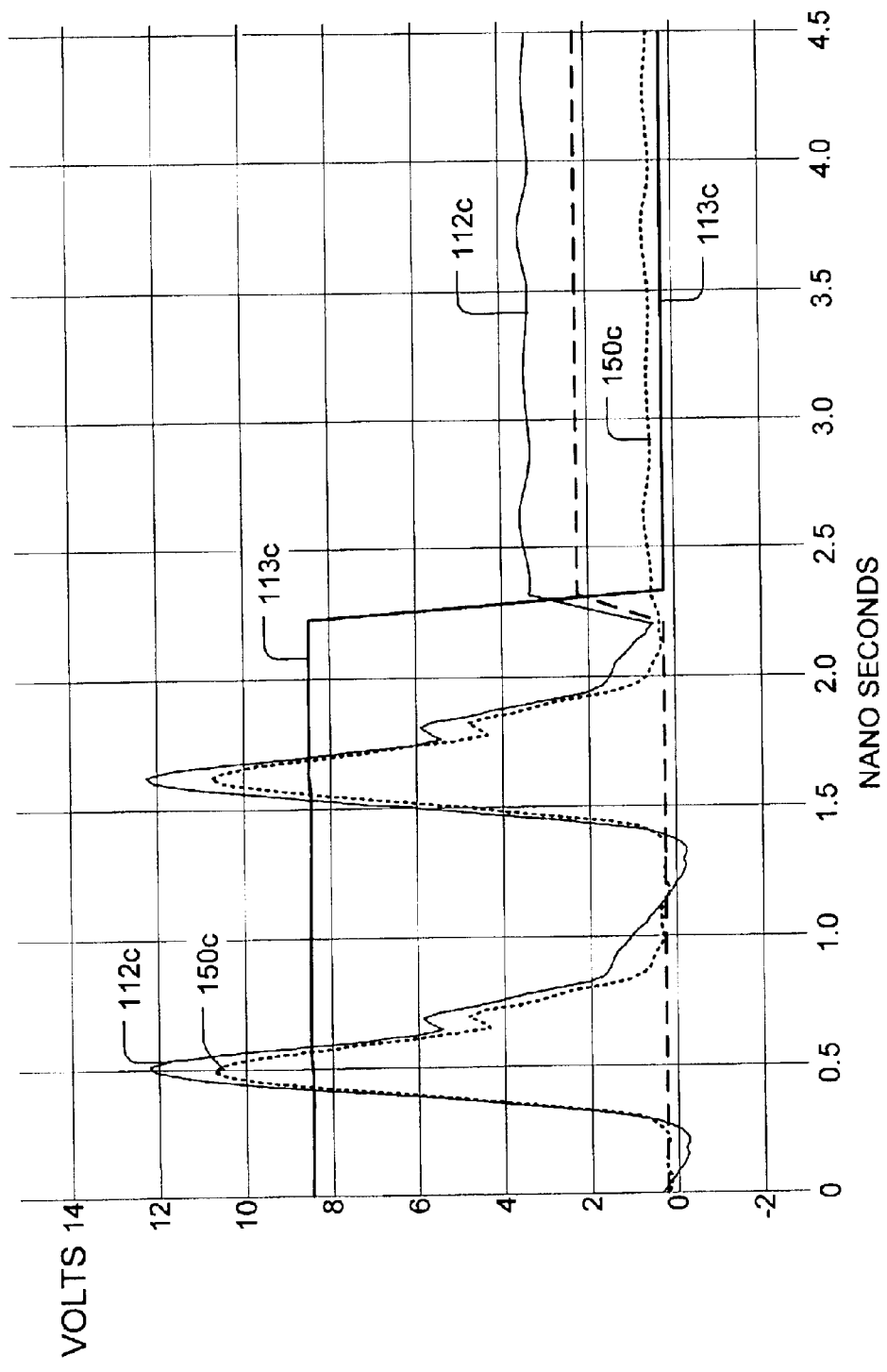
FIG. 7 illustrates additional graphs showing waveforms at various nodes of the amplifier circuit of FIGS. 3 and 4.

FIG. 7 shows representative voltage signal waveforms on various nodes of peak-to-peak detector 108 that are modeled to conform to a sample GSM radio protocol. The waveforms illustrated in FIG. 7 are similar or analogous to the waveforms of FIG. 5. For convenience, waveforms in FIG. 7 that are similar to corresponding waveforms in FIG. 6 are assigned the same reference numerals accompanied by letter "c."

FIG. 7 illustrates amplified radio frequency signal 115c, first intermediate signal 150c, second intermediate signal 113c, and comparator output signal 105c. The amplified RF signal 112c is shown having both a large voltage amplitude (between zero and two nanoseconds) and a small voltage amplitude (between 2.0 nanoseconds and 4.5 nanoseconds). Note that even for an amplified GSM radio signal 112c with a large peak-to-peak voltage of about 4 volts, as illustrated, the "ripple" voltage amplitude of the second intermediate signal 113 is relatively small and barely noticeable in FIG. 10.

The invention sees application in fields other than mobile communications. In an alternative embodiment, a temperature and process compensated peak-to-peak detector is used in test instrumentation to measure signals over a wide dynamic power range.

Although certain specific exemplary embodiments are described above in order to illustrate the invention, the invention is not limited to the specific embodiments. For example, embodiments of the invention can be used to amplify RF signals conforming many types of radio protocols other than the GSM standard, such as D-AMPS (Digital-Advanced Mobile Phone Service), cdmaOne (code-division multiple access-one), GPRS (General Packet Radio Services), EDGE (Enhanced Data GSM Environment), cdma2000, WCDMA (wideband CDMA), and TD-SCDMA (Time Division—Synchronous CDMA). Accordingly, various modifications, adaptations, and combinations of various features of the described embodiments can be practiced without departing from the scope of the invention as set forth in the following claims.

What is claimed is:

1. An amplifier circuit, comprising:
    an amplifier amplifying an input signal to generate an amplified signal;
    a peak-to-peak detector connected to said amplifier detecting peak-to-peak voltage of the amplified signal to generate a detected signal, said peak-to-peak detector having a negative-peak detector and a positive-peak detector; and
    a comparator connected to said amplifier and said peak-to-peak detector comparing the detected signal to a reference signal to generate an automatic power control signal for controlling said amplifier.

2. An amplifier circuit, comprising:
    an amplifier amplifying an input signal to generate an amplified signal;
    a peak-to-peak detector connected to said amplifier detecting peak-to-peak voltage of the amplified signal to generate a detected signal;
    a comparator connected to said amplifier and said peak-to-peak detector comparing the detected signal to a reference signal to generate an automatic power control signal for controlling said amplifier;
    wherein said peak-to-peak detector comprises
        a negative peak detector generating a first intermediate signal; and
        a positive peak detector receiving said first intermediate signal and generating said detected signal.

3. The circuit recited in claim 2 wherein said negative peak detector comprises a temperature and process compensating reference voltage generator for generating a temperature and process compensating reference voltage.

4. The circuit recited in claim 2 wherein said positive peak detector comprises:
    a diode-connected transistor; and
    a ripple filter, connected to said diode-connected transistor.

5. The circuit recited in claim 1 wherein said amplifier and said peak-to-peak detector are fabricated on a single integrated circuit.

6. The circuit recited in claim 1 wherein said amplifier and said peak-to-peak detector comprise an enhancement-mode pseudomorphic high-electron-mobility transistor (ePHEMT).

7. The circuit recited in claim 1 wherein said peak-to-peak detector contains a component of the type taken from the group consisting of: MOSFETs (Metal Oxide Semiconductor Field Effect Transistors), CMOS FETs, Silicon Bipolar Transistors and HBTs (Heterojunction Bipolar Transistors), and Schottky diode.

8. The circuit recited in claim 1 wherein the input RF signal has a frequency greater than 400 MHz.

9. An integrated circuit comprising:
    a negative peak detector receiving an input signal and generating a first intermediate signal, the input signal having a peak-to-peak voltage amplitude; and
    a positive peak detector receiving said first intermediate signal and generating a detected signal, the detected signal having a voltage proportional to the peak-to-peak voltage amplitude of the input signal.

10. The integrated circuit of claim 9 wherein the input signal has a frequency greater than 400 MHz.

11. The integrated circuit of claim 9 wherein said negative peak detector comprises a temperature and process compensating reference voltage generator for generating temperature and process compensating reference voltage.

12. The integrated circuit of claim 9 wherein said positive peak detector comprises:
   a diode-connected transistor; and
   a ripple filter, connected to said diode-connected transistor.

13. The integrated circuit of claim 9 wherein said negative peak detector comprises a plurality of transistors, each of the transistors having an identical threshold voltage (VTH).

14. The integrated circuit of claim 13, wherein
   said first intermediate signal having a first peak-to-peak voltage amplitude proportional to the peak-to-peak voltage amplitude of the input signal and having a time domain voltage signal waveform,
   said first intermediate signal further having a first direct current voltage component, said first direct current voltage component being substantially equal to the integral of the time domain voltage signal waveform of the first intermediate signal throughout a time period, divided by the time period, plus an integer multiple of the threshold voltage (VTH).

15. A method of amplifying a signal, the method comprising:
   amplifying an input RF signal to generate an amplified signal;
   detecting a peak-to-peak voltage of said amplified signal using a peak-to-peak detector, the peak-to-peak voltage including voltage from a positive peak to a negative peak;
   comparing said detected voltage to a reference voltage to produce an automatic power control input signal; and
   applying the automatic power control input signal to said amplifier to control a degree of amplification of the input RF signal.

16. A method of amplifying a signal, the method comprising:
   amplifying an input RF signal to generate an amplified signal;
   detecting peak-to-peak voltage of said amplified signal using a peak-to-peak detector;
   comparing said detected voltage to a reference voltage to produce an automatic power control input signal;
   applying the automatic power control input signal to said amplifier to control a degree of amplification of the input RE signal; and
   wherein said step of detecting comprises:
      generating a first intermediate signal having a first direct current voltage component from said amplified signal; and
      generating a second intermediate signal as the detected voltage from said first intermediate signal.

17. The method of claim 16, wherein the amplified signal has a frequency greater than 400 MHz.

18. The method of claim 16, wherein the amplified radio frequency signal conforms to GSM protocol.

\* \* \* \* \*